(12) United States Patent
Chan

(10) Patent No.: US 7,713,818 B2
(45) Date of Patent: May 11, 2010

(54) DOUBLE PATTERNING METHOD

(75) Inventor: Michael Chan, Mountain View, CA (US)

(73) Assignee: SanDisk 3D, LLC, Milpitas, CA (US)

( * ) Notice: Subject to any disclaimer, the term of this patent is extended or adjusted under 35 U.S.C. 154(b) by 0 days.

(21) Appl. No.: 12/216,107

(22) Filed: Jun. 30, 2008

(65) Prior Publication Data

US 2009/0258501 A1   Oct. 15, 2009

Related U.S. Application Data

(60) Provisional application No. 61/071,094, filed on Apr. 11, 2008.

(51) Int. Cl.
*H01L 21/336* (2006.01)
(52) U.S. Cl. ............... 438/257; 438/705; 438/714; 438/717; 438/725
(58) Field of Classification Search ............... None
See application file for complete search history.

(56) References Cited

U.S. PATENT DOCUMENTS

| | | | |
|---|---|---|---|
| 4,201,800 A | | 5/1980 | Alcorn et al. |
| 5,024,971 A | | 6/1991 | Baker et al. |
| 5,482,885 A | | 1/1996 | Lur et al. |
| 5,667,940 A | | 9/1997 | Hsue et al. |
| 5,739,068 A | | 4/1998 | Jost et al. |
| 5,915,167 A | | 6/1999 | Leedy |
| 6,140,234 A | * | 10/2000 | Uzoh et al. ............... 438/678 |
| 6,221,562 B1 | | 4/2001 | Boyd et al. |
| 6,492,075 B1 | | 12/2002 | Templeton et al. |
| 6,853,049 B2 | | 2/2005 | Herner |
| 6,855,614 B2 | | 2/2005 | Metzler |
| 6,946,719 B2 | | 9/2005 | Petti et al. |
| 6,952,030 B2 | | 10/2005 | Herner et al. |
| 7,078,348 B1 | | 7/2006 | Singh et al. |
| 7,271,057 B2 | | 9/2007 | Eppich |
| 7,514,204 B2 | * | 4/2009 | Hatakeyama et al. .... 430/270.1 |
| 2002/0052068 A1 | | 5/2002 | Juengling |
| 2002/0172901 A1 | | 11/2002 | Tokushima |
| 2003/0178684 A1 | | 9/2003 | Nakamura |

(Continued)

FOREIGN PATENT DOCUMENTS

EP   0 288 739 A2   11/1988

(Continued)

OTHER PUBLICATIONS

U.S. Appl. No. 11/864,205, filed Sep. 28, 2007, Yung-Tin Chen et al.

(Continued)

*Primary Examiner*—Zandra Smith
*Assistant Examiner*—Khanh B Duong
(74) *Attorney, Agent, or Firm*—Foley & Lardner LLP

(57) ABSTRACT

A method of making a device includes forming a first photoresist layer over an underlying layer, patterning the first photoresist layer to form a first photoresist pattern, rendering the first photoresist pattern insoluble to a solvent, forming a second photoresist layer over the first photoresist pattern, patterning the second photoresist layer to form a second photoresist pattern over the underlying layer, and etching the underlying layer using both the first and the second photoresist patterns as a mask.

21 Claims, 7 Drawing Sheets

U.S. PATENT DOCUMENTS

| | | |
|---|---|---|
| 2005/0014385 A1 | 1/2005 | Ghozeil et al. |
| 2005/0052915 A1 | 3/2005 | Herner et al. |
| 2005/0170294 A1 | 8/2005 | Kobayashi |
| 2005/0196684 A1 | 9/2005 | Nakamura et al. |
| 2005/0226067 A1 | 10/2005 | Herner et al. |
| 2006/0035167 A1* | 2/2006 | Angelopoulos et al. .. 430/270.1 |
| 2006/0105476 A1 | 5/2006 | Choi et al. |
| 2006/0154182 A1 | 7/2006 | Brodsky |
| 2006/0216937 A1 | 9/2006 | Dunton et al. |
| 2006/0250836 A1 | 11/2006 | Herner et al. |
| 2006/0250837 A1 | 11/2006 | Herner et al. |
| 2007/0049035 A1 | 3/2007 | Tran |
| 2007/0072360 A1 | 3/2007 | Kumar et al. |
| 2007/0099431 A1 | 5/2007 | Li |
| 2007/0158688 A1 | 7/2007 | Caspary et al. |
| 2007/0164309 A1 | 7/2007 | Kumar et al. |
| 2007/0176160 A1 | 8/2007 | Uchiyama et al. |
| 2007/0212889 A1 | 9/2007 | Abatchev et al. |
| 2007/0269746 A1 | 11/2007 | Nakamura |
| 2008/0014533 A1 | 1/2008 | Keller et al. |
| 2008/0085600 A1 | 4/2008 | Furukawa et al. |
| 2008/0241736 A1* | 10/2008 | Kobayashi et al. ....... 430/270.1 |
| 2008/0248654 A1* | 10/2008 | Jung ......................... 438/736 |
| 2009/0179310 A1 | 7/2009 | Dunton et al. |
| 2009/0181515 A1 | 7/2009 | Herner et al. |

FOREIGN PATENT DOCUMENTS

| | | |
|---|---|---|
| EP | 1 818 977 A2 | 8/2007 |
| GB | 1 476 585 | 6/1977 |
| JP | 2008-83537 | 4/2008 |
| KR | 2007-0122049 | 12/2007 |
| WO | WO 2008/114644 A1 | 9/2008 |

OTHER PUBLICATIONS

U.S. Appl. No. 11/819,595, filed Jun. 28, 2007, Kumar.
U.S. Appl. No. 11/864,532, filed Sep. 28, 2007, Maxwell.
Ryoung-han Kim et al, "Double Exposure Using 193nm Negative Tone Photoresist", 2007, SPIE 6520-95, 8 pgs.
U.S. Appl. No. 12/222,293, filed Aug. 6, 2008, Chan.
Nakamura, Hiroko, et al., "Low $k$ Contact Hole Formation by Double Line and Space Formation Method with Contact Hole Mask and Dipole Illumination", The Japan Society of Applied Physics, 2006, vol. 45, No. 6b, pp. 5409-5417.
Nakamura, Hiroko, et al., Contact Hole Formation by Multiple Exposure Technique in Ultra-low $k$ Lithography, Proceedings of SPIE, vol. 5377, 2004m pp. 255-265.
International Search Report and Written Opinion mailed Jun. 8, 2009 in International Application No. PCT/US2009/039121.
International Search Report and Written Opinion mailed Jun. 8, 2009 in International Application No. PCT/US2009/039124.
Office Action mailed Jul. 28, 2009 received in U.S. Appl. No. 12/149,151.
International Search Report and Written Opinion mailed Sep. 7, 2009, received in International Application No. PCT/US2009/002400 (16 pgs.).
Office Action mailed Jul. 22, 2009 received in U.S. Appl. No. 12/000,758.
Office Action mailed Mar. 30, 2009 received in U.S. Appl. No. 11/864,205.
Ishibashi, Takeo et al., "Advanced Micro-Lithography Process for i-line Lithography," Jpn. J. Appl. Phys. vol. 40, Part I, No. 12, 2001, pp. 7156-7161.

* cited by examiner

First image defined

Apply protective coating

Coating reacts with residual acids in resist to form barrier layer

Barrier now "protects" around first image

Apply resist #2 (thinner viscosity), shift, and expose

Develop to reveal first and second resist patterns; pitch doubles

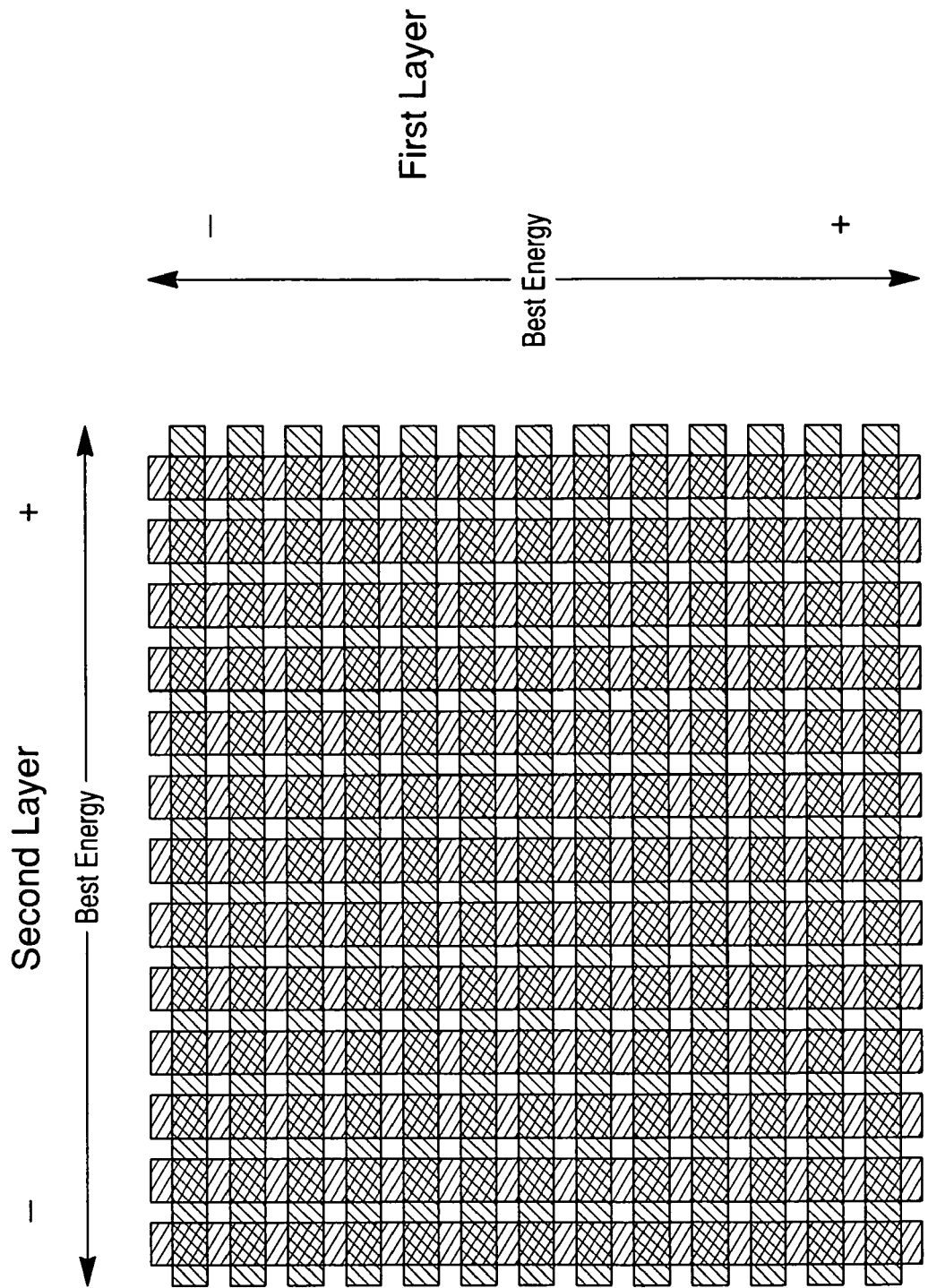

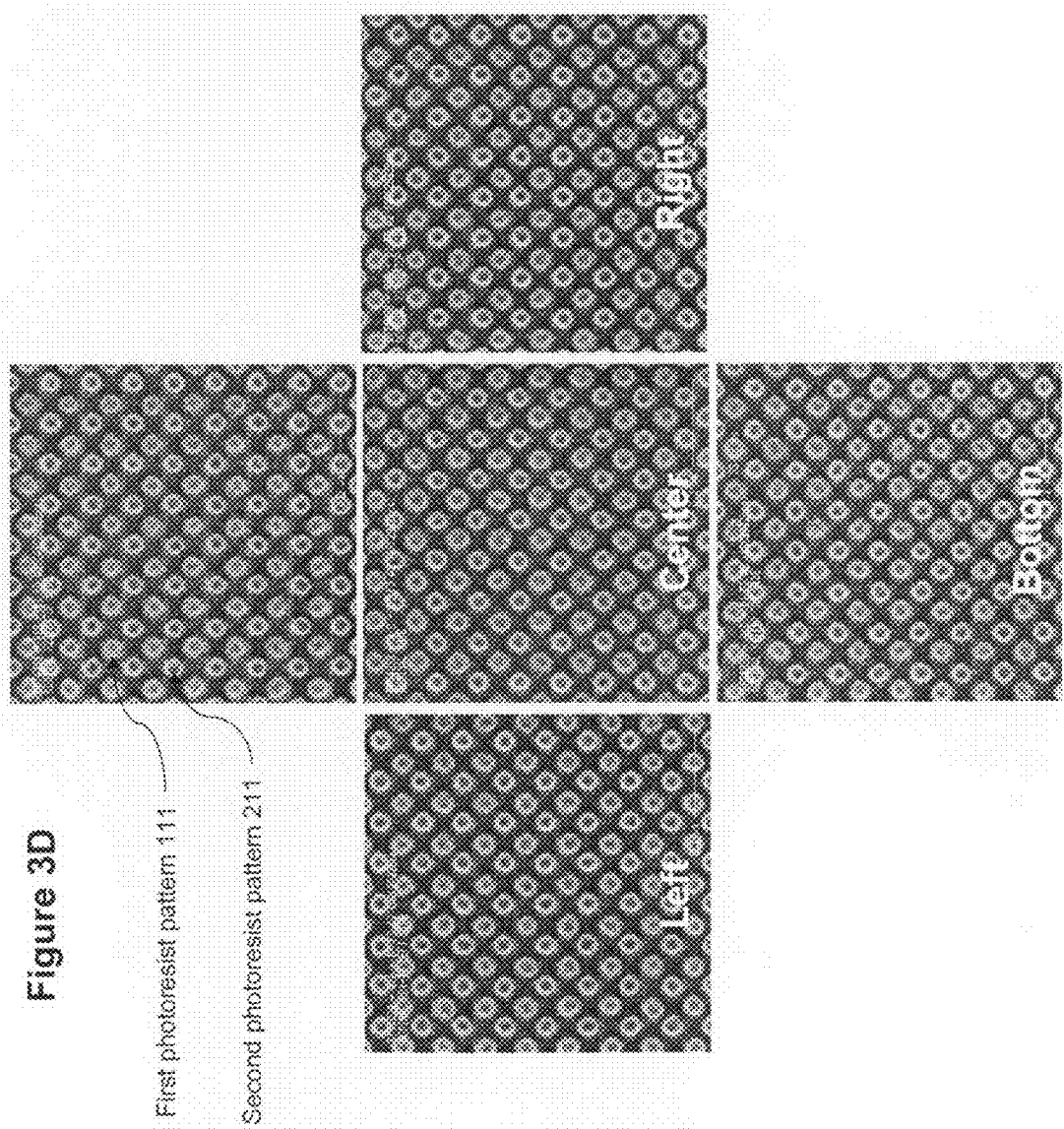

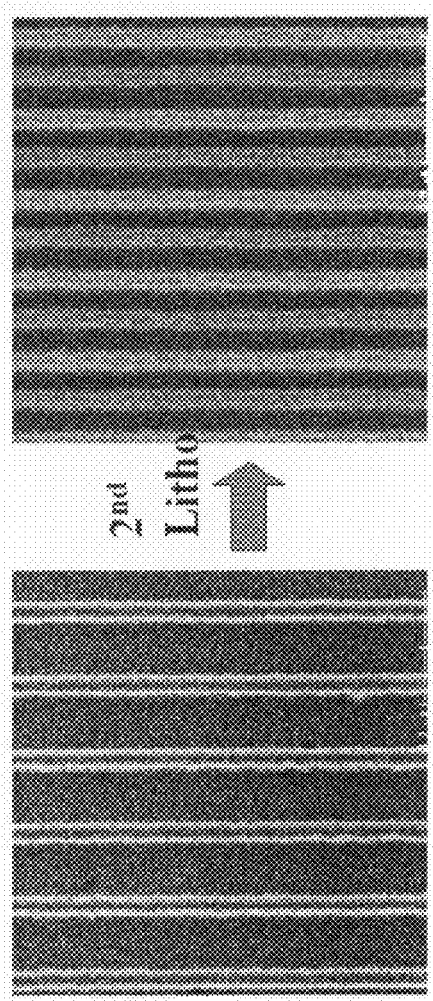
Figure 4A
Figure 4B
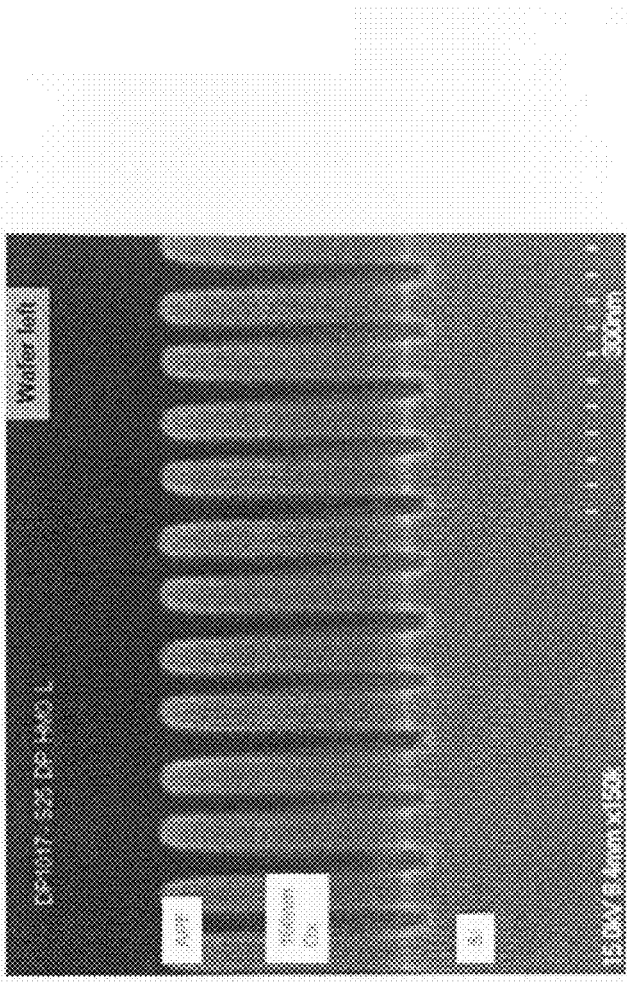
Figure 4C

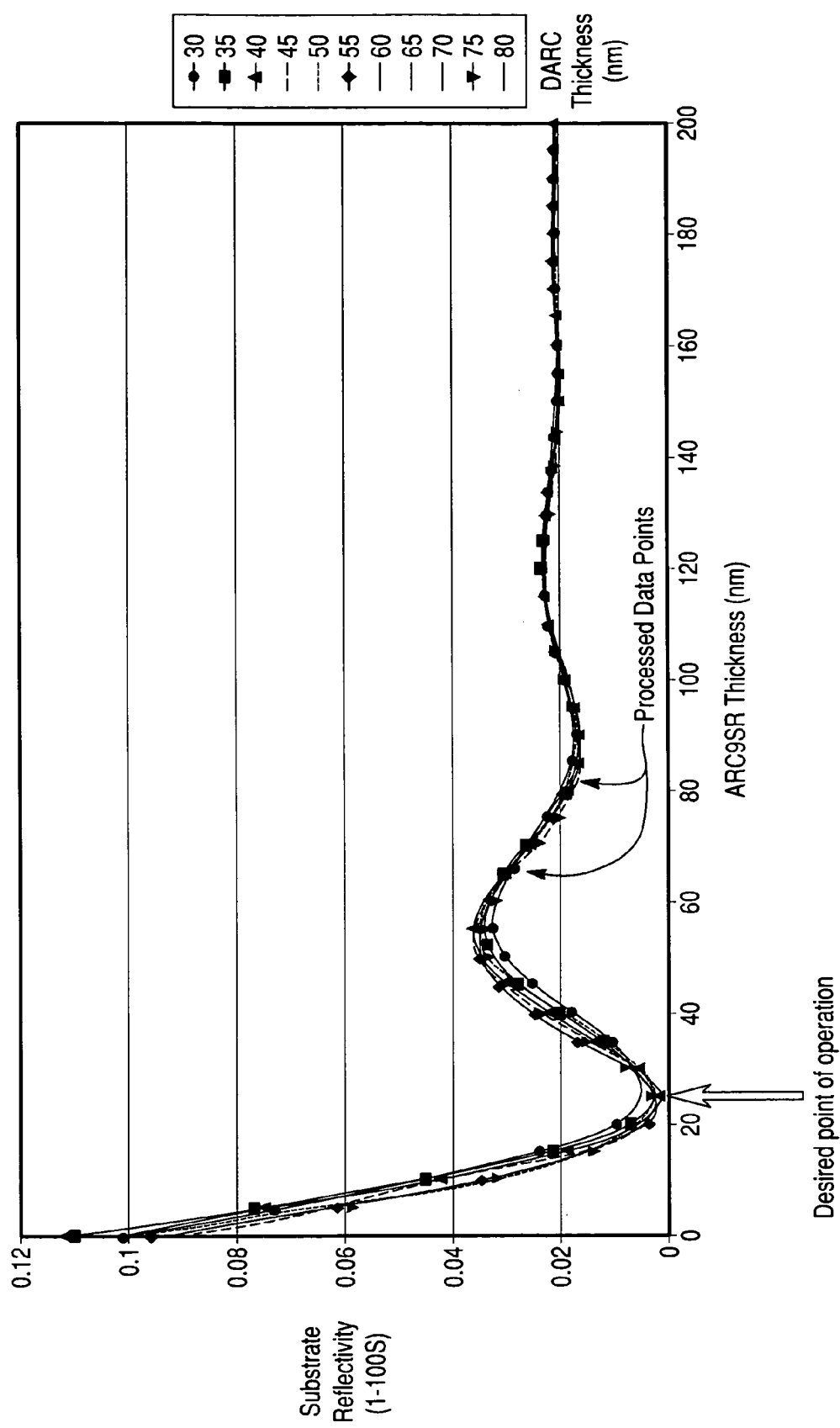

DOUBLE PATTERNING METHOD

BACKGROUND OF THE INVENTION

The invention relates generally to a photolithography method for making a semiconductor device, for example, a diode containing nonvolatile memory array.

One prior art process using a hard mask stack shown in FIG. 1A can be used to fabricate 45 nm and 80 nm features. The stack consists of a layer of organic hard mask 103, also known as an amorphous carbon advanced patterning film (APF), a layer of Dielectric Anti-Reflective Coating (DARC) 106, such as silicon oxynitride, on top of organic hard mask 103, and a Bottom Anti-Refection Coating (BARC) 109 layer, such as an organic BARC layer, on top of DARC layer 106. A photoresist 111 can be coated above the BARC layer.

SUMMARY OF THE EMBODIMENTS

One embodiment of the invention provides a method of making a device, comprising forming a first photoresist layer over an underlying layer, patterning the first photoresist layer to form a first photoresist pattern, rendering the first photoresist pattern insoluble to a solvent, forming a second photoresist layer over the first photoresist pattern, patterning the second photoresist layer to form a second photoresist pattern over the underlying layer, and etching the underlying layer using both the first and the second photoresist patterns as a mask.

Another embodiment of the invention provides a method of making a device, comprising forming a device layer, forming an organic hard mask layer over the device layer, forming a DARC layer over the organic hard mask layer, forming a BARC layer over the DARC layer, forming a first photoresist layer over the BARC layer, patterning the first photoresist layer to form a first photoresist pattern, forming a barrier layer on the first photoresist pattern, forming a second photoresist layer over the first photoresist pattern, patterning the second photoresist layer to form a second photoresist pattern over the device layer patterning the DARC layer using the combination of the first and the second photoresist patterns as a mask, patterning the organic hard mask layer using at least the patterned DARC layer as a mask, and patterning the device layer using at least the organic hard mask layer as a mask.

BRIEF DESCRIPTION OF THE DRAWINGS

FIG. 2G is a illustrative top view of a matrix of a first radiation energy dose and a second radiation energy dose applied for patterning the first photoresist layer and patterning the second photoresist layer respectively.

FIG. 3D are images of the first photoresist pattern, taken at various positions of a same wafer (i.e., top, bottom, left, right, and center of the wafer), after the step of rendering the first photoresist pattern insoluble, and prior to the step of patterning the second photoresist.

FIG. 4A is a top image of a first photoresist pattern after the step of pattering the first photoresist layer. FIG. 4B is a top image of the photoresist pattern after the step of patterning the second photoresist layer. FIG. 4C is a side cross-sectional image of an array of lines at 32 nm half-pitch formed by etching using both the first photoresist layer and the second photoresist layer as a mask.

FIG. 5 is a plot of substrate reflectivity versus BARC layer thickness as a function of DARC layer thickness.

DETAILED DESCRIPTION OF THE PREFERRED EMBODIMENTS

Figure 1A:
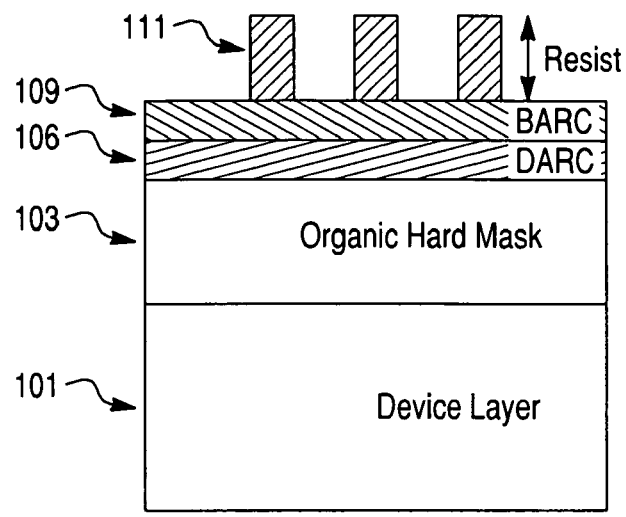
FIG. 1A is a side cross-sectional view illustrating a prior art hard mask configuration.
Figure 2A:
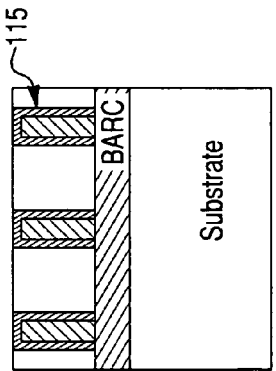
FIGS. 2A-2F are side cross-sectional views illustrating a process flow of one embodiment.
Figure 2B:
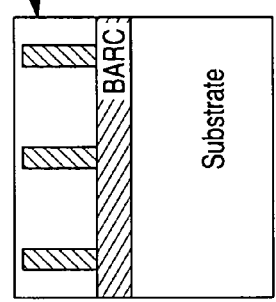
Figure 2C:
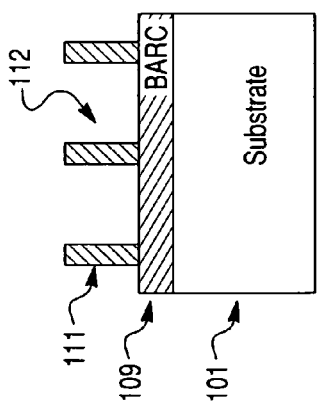
Figure 2D:
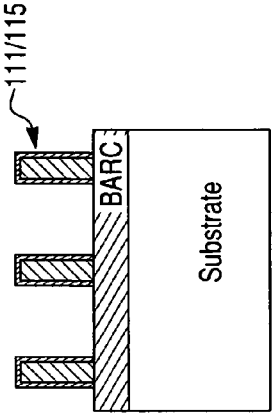

One embodiment of the invention provides a method of making a device, comprising forming a first photoresist layer over an underlying layer, as shown in FIG. 2A. The underlying layer is selected from one or more of the BARC layer (which can be an organic dielectric material), the DARC layer, the organic hard mask layer (such as the amorphous carbon advanced patterning film (APF)) and/or the device layer (such as an insulating, semiconductor or a conductive layer), as shown in FIG. 1A. Preferably, the organic hard mask layer is formed over the device layer, the DARC layer is formed over the organic hard mask layer, and the BARC layer is formed over the DARC layer. An optional silicon oxide hard mask layer can be formed over the organic hard mask layer and under the DARC layer. If desired, the BARC layer may be omitted if the oxide hard mask is provided. Any one or more of the hard mask and antireflective layers can be omitted. Only the BARC layer 109 and the photoresist layer are shown for clarity over the substrate or device layer 101 in FIG. 2A. The first photoresist layer is patterned to form a first photoresist pattern 111. In some embodiments, a barrier layer is formed on the first photoresist pattern 111 by applying a reactive reagent layer 113 over the pattern, as shown in FIG. 2B, causing the residual acids in the resist pattern 111 to chemically react with layer 113 to form a barrier layer or coating 115 on the resist pattern 111 upper and side surfaces (i.e., to "freeze" the resist pattern 111), as shown in FIG. 2C, and selectively removing the residual portions of layer 113, as shown in FIG. 2D. Reactive agents using other "freezing" mechanisms can also be used to form the barrier layer or coating.

Figure 2E:
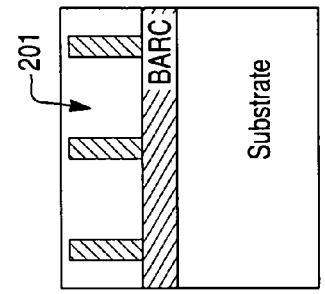
Figure 2F:
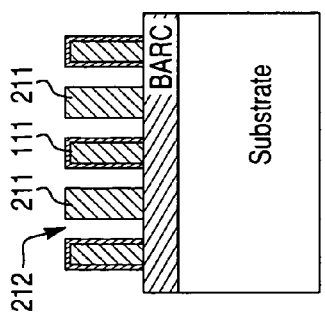

A second photoresist layer 201 is formed over the first photoresist pattern 111, as shown in FIG. 2E. The second photoresist layer is then patterned to form a second photoresist pattern 211 over the underlying layer as shown in FIG. 2F, to double the pitch of the patterns. The underlying layer is then etched using both the first and the second photoresist patterns as a mask. The first photoresist layer comprises a first composition and the second photoresist comprises a second composition. The first composition and the second composition can be same or different. For example, the second composition may have a thinner viscosity than the first composition.

The barrier layer 115 comprises a thin polymer film (such as a monolayer film) having a thickness of less than 10 nm, preferably about 1-2 nm, which is disposed on a surface of the first photoresist pattern 111. The increase in critical dimension of the first photoresist pattern before and after forming barrier layer 115 may or may not be observable. The underlying layer 109 is exposed in first openings 112 in the first photoresist pattern. The barrier layer protects the first photoresist pattern from being dissolved by a solvent during the step of patterning the second photoresist layer.

The first and second photoresist materials may be any suitable photoresist material(s), preferably acrylate materials, such as poly(methyl acrylate) or poly(methyl methacrylate). The first and second photoresist materials may be same or different materials. In some embodiments, the barrier layer 115 is formed by reacting the first photoresist pattern with a reactive material 113 to form the monolayer thick polymeric barrier layer. This barrier layer can be formed by causing cross-linking on the surface of the pattern 111 or by any other suitable methods. In some embodiments, when the first photoresist is an acrylic material, the freezing reagent may be the same acrylic material with an active functional group on the side chain. The reactive material 113 can be a chemical shrink material, such as CSX004, FZX F112, FZX F114 which comprises a poly(methyl)acrylate derivative, melamine resin, and other ingredients including water, methyl isobutyl carbinol, n-butyl alcohol, or combinations thereof. For example, FZX F114 comprises a poly(methyl)acrylate derivative, and a solvent containing methyl isobutyl carbinol and n-butyl alcohol having a volume ratio of 70:30 to 90:10, such as a volume ratio of 80:20. CSX004, FZX F112, and FZX F114 are all available from JSR Micro (http://www.jsr-micro.com). Another chemical shrink material, RELACS® available from AZ Electronic Materials or other reactive reagents which are used in the prior art to reduce the dimensions of openings between adjacent resist patterns (i.e., which are used to widen small resist patterns), may also be used. The cross-linking may be achieved by heating material 113 for 1-2 minutes at a temperature between 130° C. and 180° C. The removal of material 113 may be achieved by development in suitable developer solution followed by a second heating step. For example, the methods described in U.S. patent application Ser. No. 11/864,205, which is incorporated by reference in their entirety, may be used.

Other freezing methods may also be used to protect the first photoresist pattern from being dissolved by a solvent(s) used (i.e. to render the first photoresist pattern insoluble) in the step of patterning the second photoresist layer. For example, a protective agent may selectively replace some functional groups of the first photoresist polymer, which in turn renders the first photoresist insoluble to the solvent(s). Alternatively, the first photoresist may crosslink under a compatible chemistry under a desired condition, such as an application of heat (e.g. a high temperature bake), or other desired treatments, to "freeze" the first photoresist pattern.

In some embodiments, the first photoresist pattern 111 comprises first openings 112, the first photoresist pattern is formed by a first exposure using a first photo mask, the second photoresist pattern 211 is formed in the first openings 112 such that second openings 212 remain between adjacent portions of the first and the second photoresist patterns. The second photoresist pattern is formed by a second exposure using a second photo mask. A combination of the first and the second photoresist patterns can have a final pitch that is double a pitch of the first photoresist pattern. The photo masks used in patterning the first photoresist layer and patterning the second photoresist layer can be the same (with shifting of mask position) or different. In some embodiments, features of "frozen" first photoresist pattern may be used as alignment marks for the second exposure.

One or more photosensitive layers can be formed and patterned over the stack described above. For example, 193 nm radiation sensitive photoresist and TArF P6239 can be used. A Bottom Anti-reflective Coating (BARC) (for example, but not limited to, ARC29SR available from Brewer Science) layer, with a desired thickness, may be added to improve the performance of the photo resist by forming a sharper resist contrast after double patterning. Other photosensitive layer or layers may also be used. Immersion lithography (i.e., a lithography which utilizes a liquid at the interface) may be used to expose the photoresist, in which water or other high-index fluids may be used as an immersion medium. A regular dry lithography may also be used. A topcoat may be used on top of the photoresist to prevent diffusion of chemical by-products into water and lens during exposure. Alternatively, a top-coat free photoresist may be used. Other lithography methods, including but not limited to regular UV or X-ray methods, may also be used.

Exposure doses used to size the photoresist into the correct critical dimension (CD) in double patterning is another important factor, and may not show a linear correlation with the resulting CD. Thus, some interaction effects cannot be fully captured through simulations. For example, the photoresist CD might get bigger or smaller after the step of the first photoresist freeze (depending on the chemistries involved), and then can get either bigger or smaller again after the second photoresist patterning. Therefore, an optimized set of exposure doses to apply with a particular chemical combination may be different to simulate. Thus, a matrix of first and second exposure doses (as shown in FIG. 2G) may be tested, on a single wafer at an predetermined focus setting, to determine an optimum set of exposure doses (i.e., a optimum value of a first exposure radiation energy for patterning the first photoresist, and an optimum value of a second exposure radiation energy for patterning the second photoresist) for double patterning.

If the DARC layer and organic hard mask (such as APF) layers are located between the photoresist and device layer, then the DARC layer is patterned using the combination of the first and the second photoresist patterns as a mask, an the organic hard mask layer is patterned using at least the patterned DARC layer as a mask, and the device layer is patterned using at least the organic hard mask layer as a mask. Photoresist layer patterns 111 and 211 may be consumed in the step of APF 103 etching, the DARC 106 (and optional oxide hard mask) may be consumed in the step of device layer 101 etching, while at least lower portion of APF layer 103 may still remain after device layer etching. The remaining APF layer 103 can then be stripped. Multiple etching steps may be conducted in one chamber or in plural chambers of a multi-chamber apparatus without breaking the vacuum.

In one embodiment, the device layer comprises a conductive material, such as a metal or metal alloy, which is patterned into line shaped electrodes. Alternatively, the device layer may comprise an insulating layer which is patterned into a desired shape or where openings or vias are etched in the insulating layer. In another embodiment, the device layer comprises at least one semiconductor layer, and the step of patterning the device layer forms an array of semiconductor pillars, and each pillar in the array of pillars comprises a diode. The diode may be a steering element of a memory cell which also includes a storage element.

In some embodiments, the storage element comprises a resistivity switching element. The resistivity switching element can be a metal oxide antifuse dielectric layer or another element, and the diode and the metal oxide antifuse dielectric layer can be arranged in series. The memory cell can be further located in a monolithic three dimensional array of memory cells. The memory cell can be a read/write memory cell or a rewritable memory cell. The memory cell type can be selected from at least one of antifuse, fuse, polysilicon memory effect cell, metal oxide memory, switchable complex metal oxide, carbon nanotube memory, graphene, amorphous or polycrystalline carbon switchable resistance material, phase change material memory, conductive bridge element, or switchable polymer memory. U.S. application Ser. Nos. 11/864,532 and 11/819,595, U.S. Published Application Numbers US 2007/0164309 A1 and US 2007/0072360 A1, and U.S. Pat. Nos. 6,946,719, 6,952,030, 6,853,049, disclosing memory cells and methods of making and/or using thereof, are hereby incorporated by reference in their entirety.

Figure 1B:
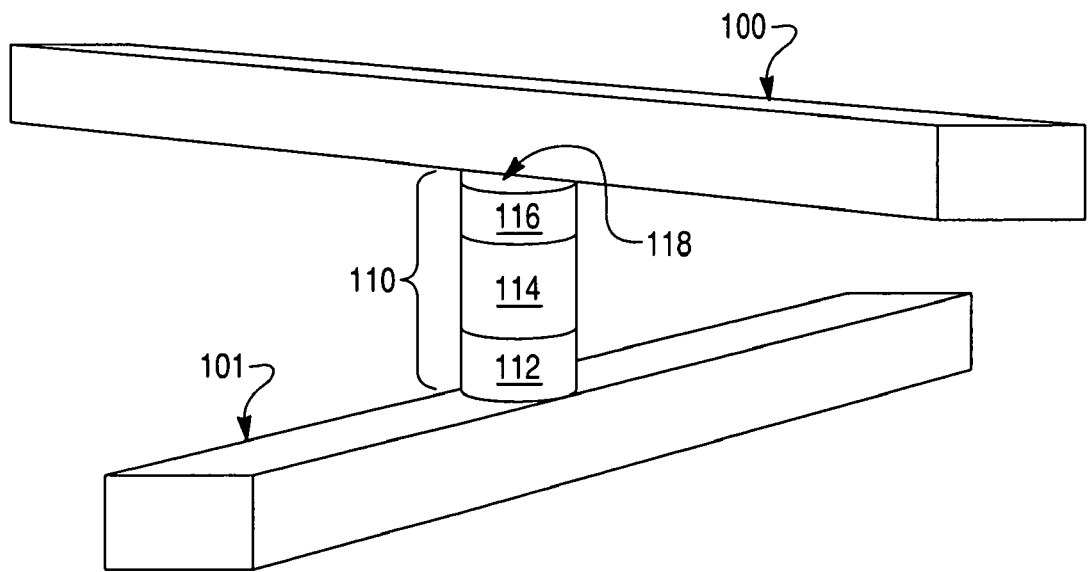
FIG. 1B is a perspective view of a memory cell formed according to a preferred embodiment of the present invention.

In preferred embodiments, the memory cell includes a cylindrical semiconductor diode located in series with the storage element. The diode and the film are disposed between two electrodes, as illustrated in FIG. 1B. The diode and the storage element may have a shape other than cylindrical, if desired. For a detailed description of a the design of a memory cell comprising a diode and a metal oxide, see for example U.S. patent application Ser. No. 11/125,939 flied on May 9, 2005 (which corresponds to US Published Application No. 2006/0250836 to Herner et al.), and U.S. patent application Ser. No. 11/395,995 filed on Mar. 31, 2006 (which corresponds to US Patent Published Application No. 2006/0250837 to Herner et al.,) each of which is hereby incorporated by reference. In the preferred embodiments of the invention, the storage element film serves as the resistivity switching element and the diode as the steering element of the memory cell.

As a non-limiting example, FIG. 1B illustrates the perspective view of a memory cell formed according to a preferred embodiment of the present invention. A bottom conductor 101 is formed of a conductive material, for example tungsten, and extends in a first direction. Barrier and adhesion layers, such as TiN layers, may be included in bottom conductor 101. The semiconductor diode 110 has a bottom heavily doped n-type region 112; an intrinsic region 114, which is not intentionally doped; and a top heavily doped p-type region 116, though the orientation of this diode may be reversed. Such a diode, regardless of its orientation, will be referred to as a p-i-n diode or simply diode. The resistivity switching layer 118 is disposed on the diode, either on the p-type region 116 or below the n-region 112 of the diode 110. Top conductor 100 may be formed in the same manner and of the same materials as bottom conductor 101, and extends in a second direction different from the first direction. The semiconductor diode 110 is vertically disposed between bottom conductor 101 and top conductor 100. The diode can comprise any single crystal, polycrystalline, or amorphous semiconductor material, such as silicon, germanium, or silicon-germanium alloys.

The memory cell may be fabricated by any suitable methods. For example, the methods described in U.S. patent application Ser. No. 11/125,939 filed on May 9, 2005 (which corresponds to US Published Application No. 2006/0250836 to Herner et al.), and U.S. patent application Ser. No. 11/395, 995 filed on Mar. 31, 2006 (which corresponds to US Patent Published Application No. 2006/0250837 to Herner et al.,) which are incorporated by reference in their entirety may be used.

The above described memory cell shown in FIG. 1B may be located in a one memory level device. If desired, additional memory levels can be formed above the first memory level to form a monolithic three dimensional memory array. In some embodiments, conductors can be shared between memory levels; i.e. top conductor 100 shown in FIG. 1B would serve as the bottom conductor of the next memory level. In other embodiments, an interlevel dielectric (not shown) is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Non-Limiting Working Example

In following non-limiting examples, a high numerical-aperture immersion scanner, and chromium-less phase-shift masks were used to form dense pillars and spaces (openings between the pillars). A BARC layer was provided over the substrate.

First, a first TArF P6239 resist, was spin coated onto the BARC layer. The final thickness of this first photoresist was around 80 nm. Other resists that consist of high loading amount of photo-acid generators, preferably one that was not bulky, such that long acid diffusion is present during the subsequent post-exposure bake may be used. After post bake at 120° C. for 60 seconds, the first photoresist is exposed to a first radiation pattern using immersion lithography, followed by a post exposure bake at 110° C. for 60 seconds and a development step for 30 seconds.

A chemical shrink, CSX004, was then applied on the first photoresist pattern. Without wishing to be bound by a particular theory, a thin polymeric monolayer is believed to have formed around the first photoresist pattern, having a thickness of around 5 nm on each side of the original boundary of the first photoresist pattern. This barrier layer protected the first photoresist pattern from being dissolved by a solvent during the step of patterning the second photoresist layer. After a bake at a temperature ranging from 130° C. to 150° C. for 60 seconds, the CSX004 treated surface was then developed in 2.38% TMAH solution for 15 seconds, followed by a surfactant-based DI water rinse.

A second photo resist is then spin coated without the BARC layer. Before exposure, the layout of the second mask is aligned over the first photoresist pattern using a pre-defined set of alignment marks and algorithm. Alternatively, the same layout pattern for the first photoresist patterning can be shifted in a manner that a combination of the first and the second photoresist patterns have a final pitch that is double a pitch of the first photoresist pattern.

Figure 3A:
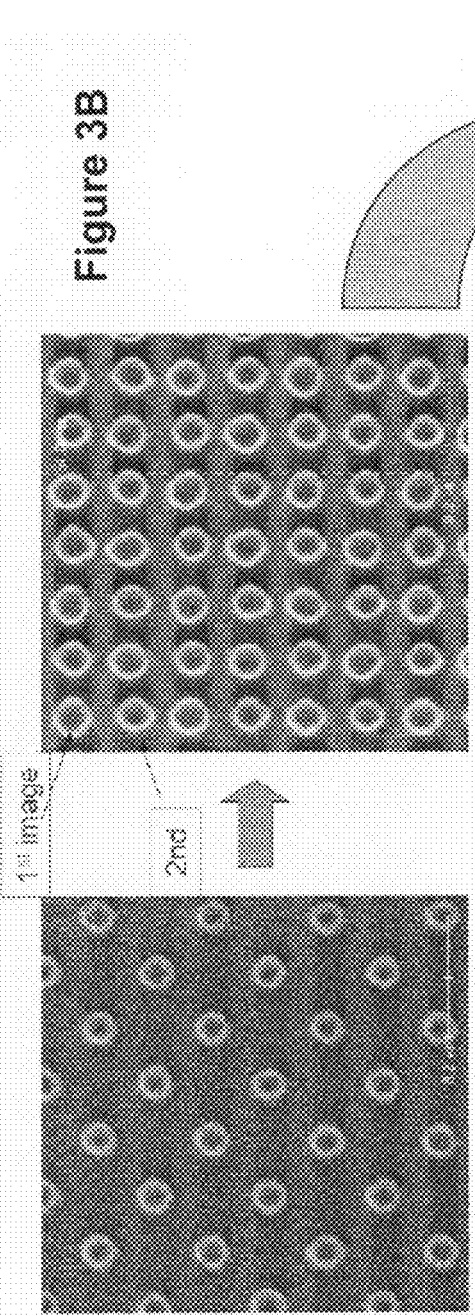
FIG. 3A is a top image of a first photoresist pattern after the step of pattering the first photoresist layer.
Figure 3B:
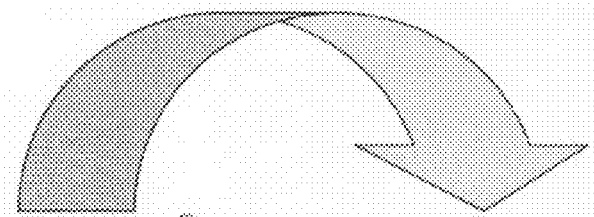
FIG. 3B is a top image of the photoresist pattern after the step of patterning the second photoresist layer.
Figure 3C:
FIG. 3C is a side cross-sectional image of an array of pillars and spaces formed by etching using both the first photoresist layer and the second photoresist layer as a mask. Photo masks containing an array of opaque dots are used for both lithography steps.

In example 1, masks having a pattern of opaque dots were used. FIG. 3A shows an image after the step of patterning the first photoresist pattern. FIG. 3B shows an image after the step of patterning the second photoresist pattern. As shown in FIGS. 3A and 3B, the combination of the first and the second photoresist patterns have a final pitch that is double a pitch of the first photoresist pattern, and the sizes of the first photoresist pillars were slightly increased by the CSX004 treatment. FIG. 3C is a cross-sectional image after etching, demonstrating the formation of an array of pillars at 32 nm half-pitch.

Alternatively, instead of CSX004, FZX F114 comprising a blend of 80% methyl isobutyl carbinol and 20% n-butyl alcohol was used as a freezing reagent applied on the first photoresist pattern to render the first photoresist pattern insoluble to a solvent, in example 2. FIG. 3D are images of the first photoresist pattern 111 and the second photoresist pattern 211, taken at various positions of a same wafer (i.e., top, bottom, left, right, and center areas of the wafer), after the step of patterning the second photoresist 211. Features of the second photoresist pattern 211 appear sharper than those of the first photoresist pattern 111 which are slightly blurred as shown in FIG. 3D. The observable contrast difference between the first photoresist pattern 111 and the second photoresist pattern 211 may be explained by a slight height difference. The images also indicate that a reduced loss of the first photoresist pattern during the freezing step was obtained by using FZX F114 as the freezing reagent.

In example 3, masks having a pattern of lines are used. A 160 nm oxide layer was located over a substrate, and an APF film was formed over the oxide layer. A BARC layer was formed over the APF film. The same process steps were used in this example, except that the illumination conditions were adjusted based on the different shape of the resist patterns according to exposure apparatus specifications. FIG. 4A shows an image after the step of patterning the first photoresist pattern. FIG. 4B shows an image after the step of patterning the second photoresist pattern. As shown in FIGS. 4A and 4B, the combination of the first and the second photoresist patterns have a final pitch that is double a pitch of the first photoresist pattern, and the widths of the first photoresist lines were slightly increased by the CSX004 treatment. FIG. 4C is a cross-sectional image after etching the oxide layer, demonstrating the formation of an array of lines at 32 nm half-pitch. A lower portion of the APF hard mask layer remained on top of the oxide layer after the step of etching, as shown in FIG. 4C. This remaining APF hard mask may be used as a mask for an optional further etching.

As described above, a BARC layer with desired thickness may improve the performance of the photoresist by forming a sharper resist contrast after double patterning. A surface reflectivity is tested on stacks with a silicon oxynitride DARC and a BARC layer having various thicknesses, to identify a desired point of operation. As shown in FIG. 5, an optimized surface reflectivity is obtained when a combination of around 15-30 nm, such as about 20-25 nm, such as 24 nm ARC29SR (a commonly used BARC material available from Brewer Science) with a DARC layer is used. The thickness of the DARC layer does not show significant impact on the surface reflectivity in this experiment, as also shown in FIG. 5. In this experiment, a 193 nm photoresist is used. When other photoresists or other BARC materials are used, the optimized surface reflectivity may be obtained at different conditions.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method of making a device, comprising:
   forming a first photoresist layer over an underlying layer;
   patterning the first photoresist layer to form a first photoresist pattern;
   rendering the first photoresist pattern insoluble to a solvent by forming a barrier layer over the first photoresist pattern;
   forming a second photoresist layer over the first photoresist pattern;
   patterning the second photoresist layer to form a second photoresist pattern; and
   etching the underlying layer using both the first and the second photoresist patterns as a mask;
   wherein:
   the barrier layer comprises a thin polymer film having a thickness of less than 10 nm which is disposed on a surface of the first photoresist pattern, such that the underlying layer is exposed in first openings in the first photoresist pattern; and
   the barrier layer protects the first photoresist pattern from being dissolved by a solvent used during the step of patterning the second photoresist layer.

2. The method of claim 1, wherein the first photoresist layer comprises a first composition and the second photoresist comprises a second composition different from the first composition.

3. The method of claim 1, wherein the first photoresist layer and the second photoresist layer have a same composition.

4. The method of claim 1, wherein the underlying layer is selected from a group consisting of BARC layer, a DARC layer, an organic hard mask layer, an oxide hard mask layer a device layer, and combination thereof.

5. The method of claim 4, wherein:
   the device layer comprises at lease one conductive layer; and
   the step of patterning the device layer forms an array of electrodes.

6. A method of claim 4, wherein:
   the device layer comprises at lease one semiconductor layer; and
   the step of patterning the device layer forms an array of semiconductor pillars.

7. The method of claim 1, wherein the barrier layer is formed by reacting the first photoresist pattern with a reactive material to form a monolayer thick polymeric barrier layer.

8. The method of claim 1, wherein:
   the first photoresist pattern comprises first openings;
   the first photoresist pattern is formed by a first exposure using a first photo mask;
   the second photoresist pattern is formed in the first openings such that second openings remain between adjacent portions of the first and the second photoresist patterns; and
   the second photoresist pattern is formed by a second exposure using a second photo mask.

9. The method of claim 8, wherein:
   a combination of the first and the second photoresist patterns have a final pitch that is double a pitch of the first photoresist pattern;
   the first and the second photo masks comprise a same or different photo masks; and
   the steps of patterning the photoresist layers are performed by immersion photolithography.

10. A method of making a device, comprising:
    forming a first photoresist layer over an underlying layer;
    patterning the first photoresist layer to form a first photoresist pattern;
    rendering the first photoresist pattern insoluble to a solvent by forming a barrier layer over the first photoresist pattern;

forming a second photoresist layer over the first photoresist pattern;

patterning the second photoresist layer to form a second photoresist pattern; and etching the underlying layer using both the first and the second photoresist patterns as a mask;

wherein:

the underlying layer is selected from a group consisting of BARC layer, a DARC layer, an organic hard mask layer, an oxide hard mask layer a device layer, and combination thereof;

the device layer comprises at lease one semiconductor layer;

the step of patterning the device layer forms an array of semiconductor pillars; and each pillar in the array of semiconductor pillars comprises a diode.

11. A method of claim 10, wherein the diode is a steering element of a memory cell and wherein the memory cell further comprises a storage element.

12. A method of claim 11, wherein the memory cell type is selected from at least one of antifuse, fuse, polysilicon memory effect cell, metal oxide memory, switchable complex metal oxide, carbon nanotube memory, graphene or polycrystalline carbon switchable resistance material, phase change material memory, conductive bridge element, or switchable polymer memory.

13. A method of claim 11, wherein the storage element comprises a resistivity switching element.

14. A method of claim 11, wherein the memory cell is a read/write memory cell or a rewritable memory cell.

15. A method of claim 11, wherein the memory cell is located in a monolithic three dimensional array of memory cells.

16. A method of making a device, comprising:

forming a device layer;

forming an organic hard mask layer over the device layer;

forming a DARC layer over the organic hard mask layer;

forming a BARC layer over the DARC layer;

forming a first photoresist layer over the BARC layer;

patterning the first photoresist layer to form a first photoresist pattern;

forming a barrier layer over the first photoresist pattern;

forming a second photoresist layer over the first photoresist pattern;

patterning the second photoresist layer to form a second photoresist pattern over the device layer;

patterning at least one of the BARC layer and the DARC layer using a combination of the first and the second photoresist patterns as a mask;

patterning the organic hard mask layer using at least the patterned DARC layer as a mask; and patterning the device layer using at least the organic hard mask layer as a mask;

wherein:

the barrier layer comprises a thin polymer film having a thickness of less than 10 nm which is disposed on a surface of the first photoresist pattern, such that the BARC layer is exposed in first openings in the first photoresist pattern; and the barrier layer protects the first photoresist pattern from being dissolved by a solvent used during the step of patterning the second photoresist layer.

17. The method of claim 16, wherein the organic hard mask layer comprises amorphous carbon.

18. A method of claim 16, wherein the steps of patterning the photoresist layers are performed by immersion photolithography.

19. A method of claim 16, wherein:

the DARC layer comprises silicon oxynitride; and the BARC layer has a thickness of 15 to 30 nm.

20. A method of claim 16, wherein:

the step of forming a barrier layer on the first photoresist pattern comprises applying a reagent over on the first photoresist pattern; and the reagent comprises a poly(methyl) acrylate derivative, methyl isobutyl carbinol, and n-butyl alcohol.

21. A method of claim 16, wherein:

the step of patterning the first photoresist layer to form a first photoresist pattern comprises exposing the first photoresist layer to a first radiation energy dose;

the step of patterning the second photoresist layer to form a second photoresist pattern over the device layer comprises exposing the second photoresist layer to a second radiation energy dose;

a first optimum value of the first radiation energy dose and a second optimum value of the second radiation energy dose are determined by testing a matrix of the first radiation energy dose and the second radiation energy dose at a predetermined focus setting; and the first optimum value is same or different from the second optimum value.

* * * * *